(12) United States Patent
Oh

(10) Patent No.: US 9,859,365 B2
(45) Date of Patent: Jan. 2, 2018

(54) HIGH VOLTAGE DEVICE AND METHOD FOR FABRICATING THE SAME

(71) Applicant: Magnachip Semiconductor, Ltd., Cheongju-si (KR)

(72) Inventor: Bo-Seok Oh, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 13/870,511

(22) Filed: Apr. 25, 2013

(65) Prior Publication Data

US 2013/0237027 A1    Sep. 12, 2013

Related U.S. Application Data

(62) Division of application No. 12/216,870, filed on Jul. 11, 2008, now Pat. No. 8,450,815.

(30) Foreign Application Priority Data

Jul. 13, 2007    (KR) .................. 10-2007-0070666

(51) Int. Cl.
| | |
|---|---|
| *H01L 29/06* | (2006.01) |
| *H01L 29/66* | (2006.01) |
| *H01L 29/78* | (2006.01) |

(52) U.S. Cl.
CPC .... *H01L 29/0653* (2013.01); *H01L 29/66575* (2013.01); *H01L 29/66719* (2013.01); *H01L 29/7834* (2013.01)

(58) Field of Classification Search
CPC ........... H01L 29/66719; H01L 29/0653; H01L 29/66575; H01L 29/7834
USPC ................................. 257/213–413, E29.256
See application file for complete search history.

(56) References Cited

U.S. PATENT DOCUMENTS

| | | | | |
|---|---|---|---|---|
| 5,998,848 A | * | 12/1999 | Brown et al. ................. | 257/407 |
| 6,087,220 A | * | 7/2000 | Rogers ............. | H01L 21/28273 |
| | | | | 257/E21.209 |
| 6,404,011 B2 | | 6/2002 | Kim et al. | |
| 6,465,768 B1 | * | 10/2002 | Ker et al. .................. | 250/214.1 |
| 6,531,732 B2 | * | 3/2003 | Sugita et al. ................. | 257/315 |
| 6,576,530 B1 | * | 6/2003 | Chen ................ | H01L 21/02164 |
| | | | | 257/E21.278 |
| 6,740,912 B1 | * | 5/2004 | Chaudhry et al. ............ | 257/288 |
| 2003/0127697 A1 | | 7/2003 | Ohta et al. | |
| 2005/0104138 A1 | * | 5/2005 | Nishibe ............. | H01L 21/26513 |
| | | | | 257/408 |

(Continued)

FOREIGN PATENT DOCUMENTS

| | | |
|---|---|---|
| KR | 10-20050063315 A | 6/2005 |
| KR | 10-2006-0006595 | 1/2006 |

OTHER PUBLICATIONS

Plummer, Silicon VLSI Technology, 2000, Prentice Hall, pp. 57-60 and 71-82.*

(Continued)

*Primary Examiner* — Tucker J Wright
(74) *Attorney, Agent, or Firm* — NSIP Law

(57) ABSTRACT

A high voltage device includes drift regions formed in a substrate, an isolation layer formed in the substrate to isolate neighboring drift regions, wherein the isolation layer has a depth greater than that of the drift region, a gate electrode formed over the substrate, and source and drain regions formed in the drift regions on both sides of the gate electrode.

22 Claims, 8 Drawing Sheets

(56) References Cited

U.S. PATENT DOCUMENTS

| | | | |
|---|---|---|---|
| 2005/0167778 A1* | 8/2005 | Kim et al. | 257/510 |
| 2005/0184335 A1* | 8/2005 | Gi Lee | 257/327 |
| 2007/0037343 A1* | 2/2007 | Colombo et al. | 438/231 |
| 2007/0096225 A1* | 5/2007 | Khemka et al. | 257/409 |
| 2007/0200184 A1 | 8/2007 | Zhu et al. | |
| 2008/0003789 A1* | 1/2008 | Chen et al. | 438/585 |
| 2008/0160706 A1* | 7/2008 | Jung | 438/297 |
| 2008/0237706 A1 | 10/2008 | Williams et al. | |

OTHER PUBLICATIONS

Plummer, Silicon VLSI Technology, 2000, Prentice Hall, pp. 57-60.*

* cited by examiner

HIGH VOLTAGE DEVICE AND METHOD FOR FABRICATING THE SAME

CROSS-REFERENCE TO RELATED APPLICATIONS

The present invention is a divisional of U.S. patent application Ser. No. 12/216,870 filed on Jul. 11, 2008, and claims the benefit of Korean Patent Application No. 10-2007-0070666 filed Jul. 13, 2007 in the Korean Patent Office. The disclosures of U.S. patent application Ser. No. 12/216,870 and Korean Patent Application No. 10-2007-0070666 are incorporated herein by reference in their entireties.

BACKGROUND OF THE INVENTION

The present invention relates to a method for fabricating a semiconductor device, and more particularly, to a high voltage device and a method for fabricating the same.

When a semiconductor integrated circuit (IC) directly controls external systems using a high voltage, a high voltage device is required in the IC, wherein the high voltage provided from the external is directly applied to the high voltage device.

FIG. 1 illustrates a cross-sectional view of a high voltage transistor among typical high voltage devices.

Referring to FIG. 1, the typical high voltage transistor includes a drift region 103 formed in a well for high voltage 101 to obtain a high breakdown voltage. Furthermore, the typical high voltage transistor includes a field stop area (FSA) formed under a field oxide layer 102 which is formed between neighboring drift regions to separate the neighboring drift regions.

In the meantime, reference numerals 100, 104, 105, 106, 107, 108 and 109 represent a substrate, a gate insulation layer, a gate electrode, a gate pattern, a spacer, a source/drain region and a pickup region, respectively.

As described above, the high voltage transistor includes the FSA formed between neighboring drift regions to isolate the neighboring drift regions. Thus, it is hard to accomplish high integration since an area where the FSA is formed is required under the field oxide layer 102 between the neighboring drift regions 103 is required.

SUMMARY OF THE INVENTION

Embodiments of the present invention relate to a high voltage device and a method for fabricating the same to accomplish high integration of a semiconductor device.

In accordance with an aspect of the present invention, there is provided a high voltage device. The high voltage device includes drift regions formed in a substrate, an isolation layer formed in the substrate to isolate neighboring drift regions, wherein the isolation layer has a depth greater than that of the drift region, a gate electrode formed over the substrate, and source and drain regions formed in the drift regions on both sides of the gate electrode.

In accordance with another aspect of the present invention, there is provided a method for fabricating a high voltage device. The method includes forming an isolation layer in a substrate to define an active region, forming drift regions with a depth less than that of the isolation layer in a portion of the active region, forming a gate electrode over the active region, and forming source and drain regions in the drift regions on both sides of the gate electrode.

DESCRIPTION OF SPECIFIC EMBODIMENTS

Hereinafter, a high voltage device and a method for fabricating the same in accordance with the present invention will be described in detail with reference to the accompanying drawings.

It will be understood that when an element such as a layer, a film, a pattern and a region is referred to as being 'on/under' another element herein, it may be directly on/under the other element, or one or more intervening elements may also be present.

Figure 1:
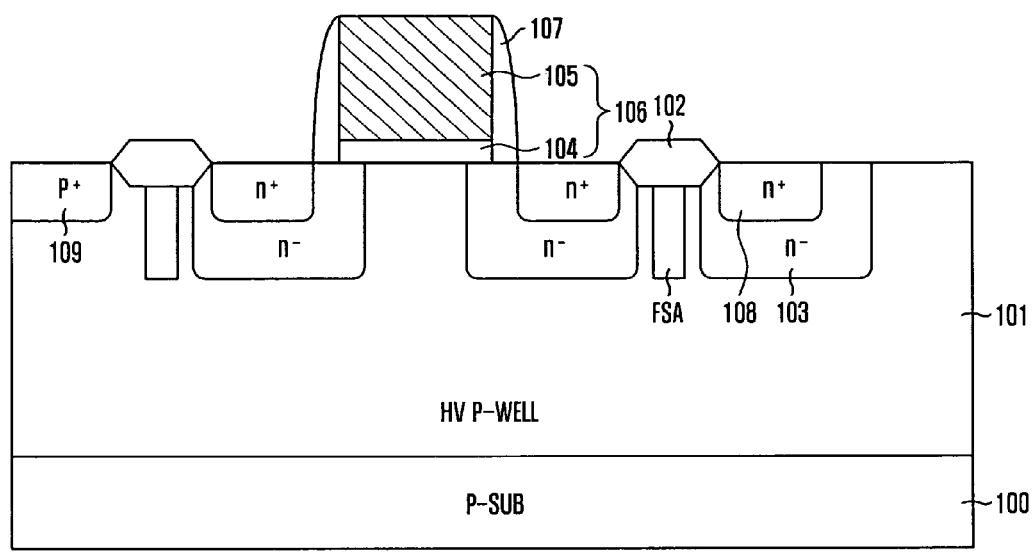
FIG. 1 illustrates a cross-sectional view of a typical high voltage device.
Figure 2:
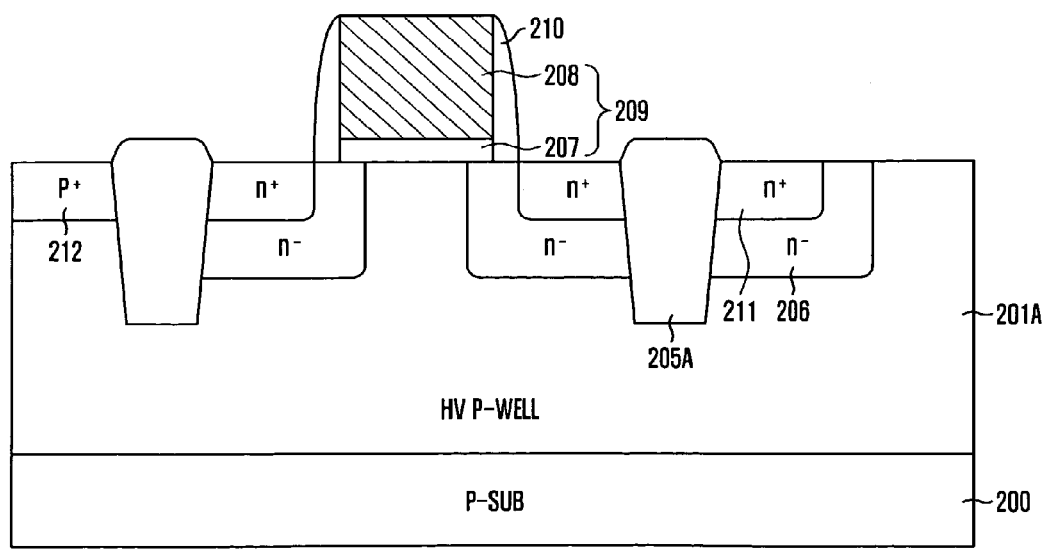
FIG. 2 illustrates a cross-sectional view of a high voltage device in accordance with an embodiment of the present invention.

FIG. 2 illustrates a cross-sectional view of a high voltage device in accordance with an embodiment of the present invention. Herein, an N-channel metal-oxide-semiconductor (NMOS) transistor is described as an example among high voltage devices.

Referring to FIG. 2, the high voltage device includes an isolation layer 205A formed over a substrate 200 in order to isolate neighboring drift regions 206. The isolation layer 205A has a trench structure formed deeper than a lowermost portion of the drift region 206 and a width of the isolation layer 205A is the same as a distance between the neighboring drift regions 206.

The width and the depth of the isolation layer 205A are determined as described hereinafter.

Figure 4A:
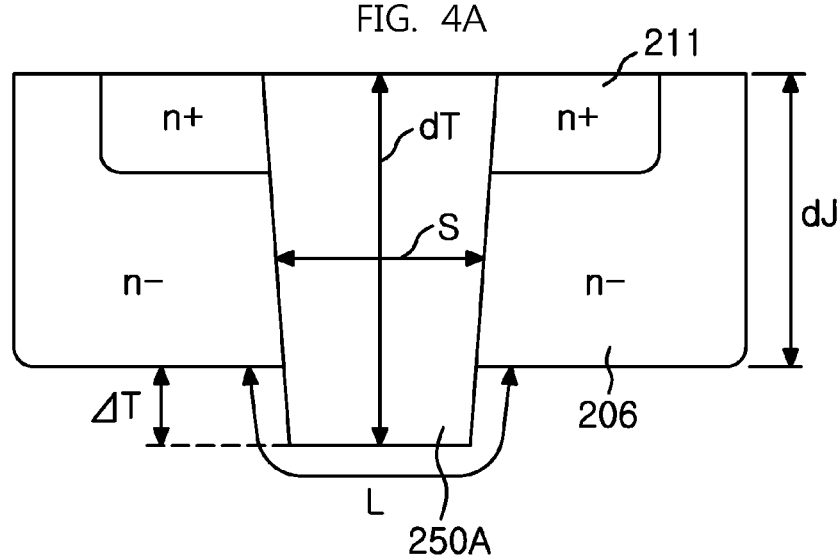
FIG. 4A illustrates a cross-sectional view of the high voltage device including an isolation layer between neighboring drift regions in accordance with the embodiment of the present invention.
Figure 4B:
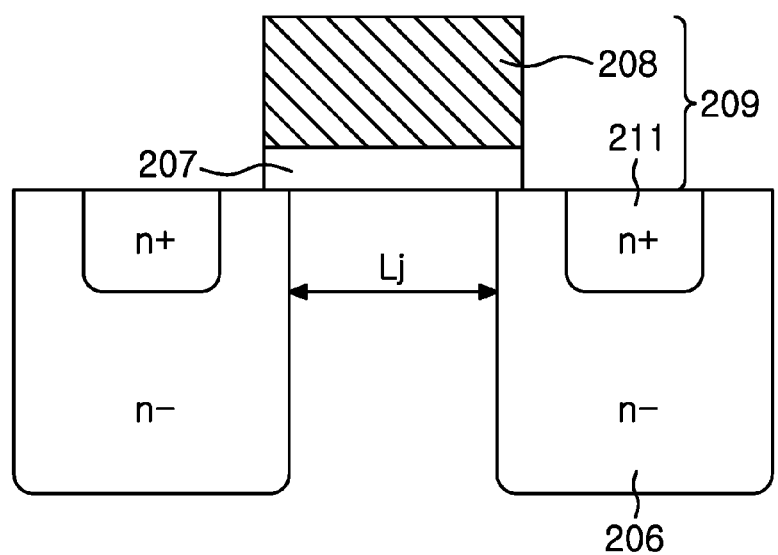
FIG. 4B illustrates a cross-sectional view of a high voltage device including a plurality of drift regions separated from each other by a predetermined distance without an isolation layer.

FIG. 4A illustrates a cross-sectional view of the high voltage device including an isolation layer between neighboring drift regions in accordance with the embodiment of the present invention and FIG. 4B illustrates a cross-sectional view of a high voltage device including a plurality of drift regions separated from each other by a predetermined distance without an isolation layer.

Referring to FIGS. 4A and 4B, when the width and the depth of the isolation layer 205A, a distance between the neighboring drift regions 206 capable of standing breakdown voltage, a depth of the drift region 206 and a depth difference between the drift region 206 and the isolation layer 205A are denoted as S, dT, Lj, dJ and ΔT, respectively, as equations explaining the structure shown in FIGS. 4A and 4B may be represented as 'ΔT=dT−dJ' and 'L≥Lj'. 'L' represents a distance between neighboring drift regions 206 when the isolation layer 205A is formed between the neighboring drift regions 206. Herein, 'L' may be represented as follow as:

$$L \approx 2(dT-dJ)+S = 2\Delta T+S \qquad [\text{Equation 1}]$$

Thus, the isolation layer 205A should have a depth greater than that of the drift region 206 in order to avoid the generation of a field stop area (FSA). That is, 'ΔT>0'.

In the meantime, when 'dJ' is increased, 'dT' should also be increased. Therefore, it is hard to form the isolation layer 205A since a filling characteristic of the isolation layer 205A may be deteriorated due to increasing of an aspect ratio of that. Thus, 'dJ' should be controlled as shallow as possible. For this, it is preferable that the drift region 206 is formed by using an ion implantation process in lieu of a diffusion process since it is easy to control a depth of the drift region 206 when the ion implantation is performed. However, when the diffusion process is performed to form the drift region 206, it is preferable to control ion diffusion to be minimized in a drive-in process is performed. Herein the drive-in process is performed after performing a pre-deposition process.

Furthermore, referring to Equation 1, when 'L' is fixed since 'L' is in proportion to 'ΔT' and 'S', 'S' may be relatively decreased when 'ΔT' is increased. Meanwhile, ΔT may not be unconditionally increased in aspects of process and device characteristics. 'L' is usually set to 'Lj' and plus approximately 20 percent of 'Lj' by considering a process margin, more preferable plus approximately 20 percent to approximately 50 percent of 'Lj'. That is, it is represented as 'Lj×1.2≤L≤Lj×1.5'.

A high voltage device for 18 V will be described hereinafter as an example, wherein the high voltage device for 18V represents the high voltage device operating at 18V.

Primarily, the depth of the drift region 206, dJ, which may be controlled by an ion implantation process, ranges from approximately 0.6 μm to approximately 0.8 μm. Thus, the isolation layer 205A should be formed to have the depth, dT, greater than dJ, e.g., more than approximately 1 μm, and more preferably approximately 1 μm to approximately 1.5 μm.

Furthermore, the distance between neighboring drift regions 206, Lj, should be maintained ranging from approximately 1.0 μm to approximately 1.2 μm in order to ensure breakdown voltage appropriate to the high voltage device for 18 V. Therefore, the width of the isolation layer 205A, S, is maintained approximately 1.0 μm, e.g., approximately 1 to approximately 1.2 μm. A width of an isolation layer in a typical high voltage device for 18 V is approximately 2.5 μm to approximately 4.0 μm.

Hereinafter, characteristics of a typical high voltage device and a high voltage device in accordance with an embodiment of the present invention are described.

Figure 5A:
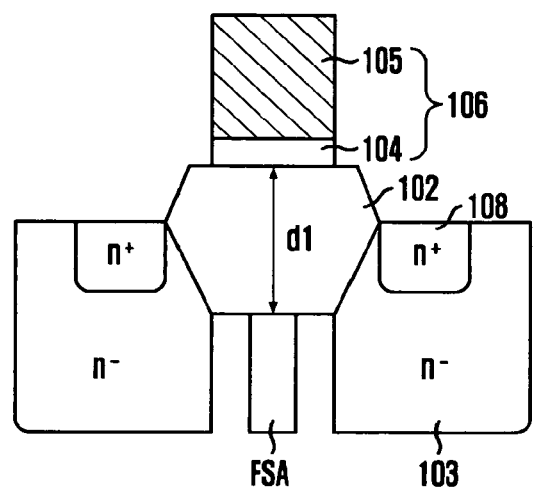
FIGS. 5A and 5B illustrate cross-sectional views for comparing a typical high voltage device and an inventive high voltage device.
Figure 5B:
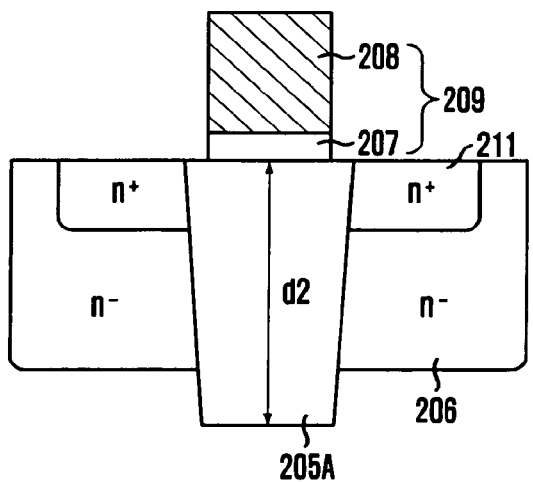

FIG. 5A illustrates a cross-sectional view of the typical high voltage device and FIG. 5B illustrates a cross-sectional view of the high voltage device in accordance with the embodiment of the present invention.

Referring to FIGS. 5A and 5B, primarily, since the drift region 103 is formed deeper than the lowermost portion of the field oxide layer 102 in the typical high voltage device, mask arrangement is essentially demanded in order to perform the stable isolation between neighboring drift regions 103 during an ion implantation process for forming the drift region 103. However, since the isolation layer 205A is formed deeper than the drift region 206 in the high voltage device in accordance with the embodiment of the present invention, the drift region 206 is self-aligned on sidewalls of the isolation layer 205A through the ion implantation process. Thus, a process for forming the drift region 206 may be simplified since an additional mask alignment is not needed.

Secondly, since the field oxide layer 102 is thin in the typical high voltage device, a channel is easily induced due to a short distance 'd1' between the gate electrode 106 and the lowermost portion of the field oxide layer 102. That is, since a threshold voltage becomes low, the FSA is essentially demanded in order to reinforce the low threshold voltage. In that case, since an area where the FSA is formed is needed, a field region is increased that much. However, since a distance 'd2' between the gate electrode 209 and the lowermost portion of the isolation layer 205A is large enough in the high voltage device in accordance with the embodiment of the present invention, a channel induction is difficult as that much and thus there is no need to form an additional FSA like in the typical high voltage device. That is, in accordance with the present invention, an effect for decreasing a field region may be obtained since the area to form the FSA is unnecessary.

In the meantime, although it will be described hereinafter, the isolation layer 205A may include a silicon-containing oxide layer, e.g., a silicon dioxide layer ($SiO_2$). It is preferable that the isolation layer 205A is formed by using a high density plasma apparatus in order to improve filling-up characteristics according to a high aspect ratio of the isolation layer 205A. For example, the isolation layer 205A may be formed of a high density plasma-undoped silicate glass (HDP-USG) layer. Besides this, the isolation layer 205A may also be formed with a stacked structure of the HDP layer and a layer formed by a spin coating method, e.g., a spin on dielectric (SOD) layer.

Hereinafter, a method for fabricating the high voltage device in accordance with the embodiment of the present invention will be described in detail.

FIGS. 3A to 3I illustrate cross-sectional views of a method for fabricating the high voltage device in accordance with the embodiment of the present invention shown in FIG. 2.

Figure 3A:
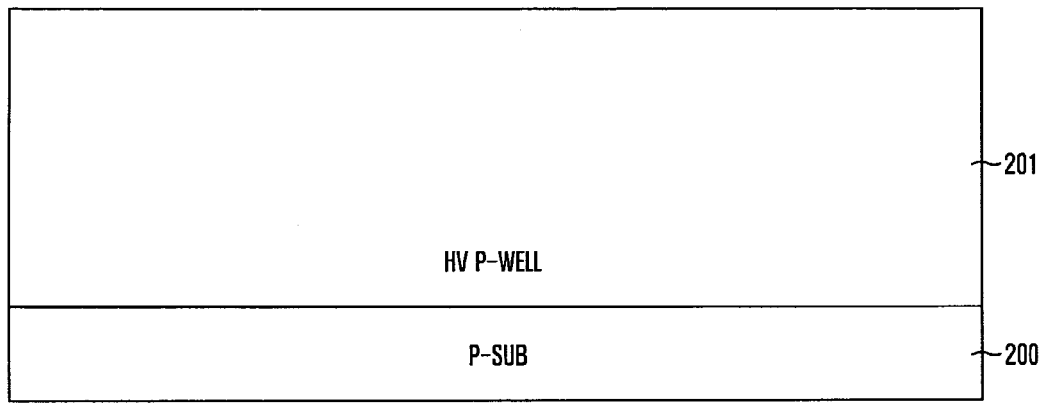
FIGS. 3A to 3I are cross-sectional views illustrating an example of a method for fabricating a high voltage device.

Referring to FIG. 3A, a well region 201 for a high voltage is formed in the substrate 200, wherein the substrate 200 may be a p-type substrate. Herein, the substrate 200 may include one selected from a group consisting of silicon (Si), germanium (Ge), silicon germanium (SiGe), gallium phosphorus (GaP), gallium arsenic (GaAs), silicon carbon (SiC), silicon-germanium-carbon (SiGeC), indium arsenide (InAs) and indium phosphorus (InP). Furthermore, the substrate 200 may be a bulk or silicon on insulator (SOI) substrate.

Figure 3B:
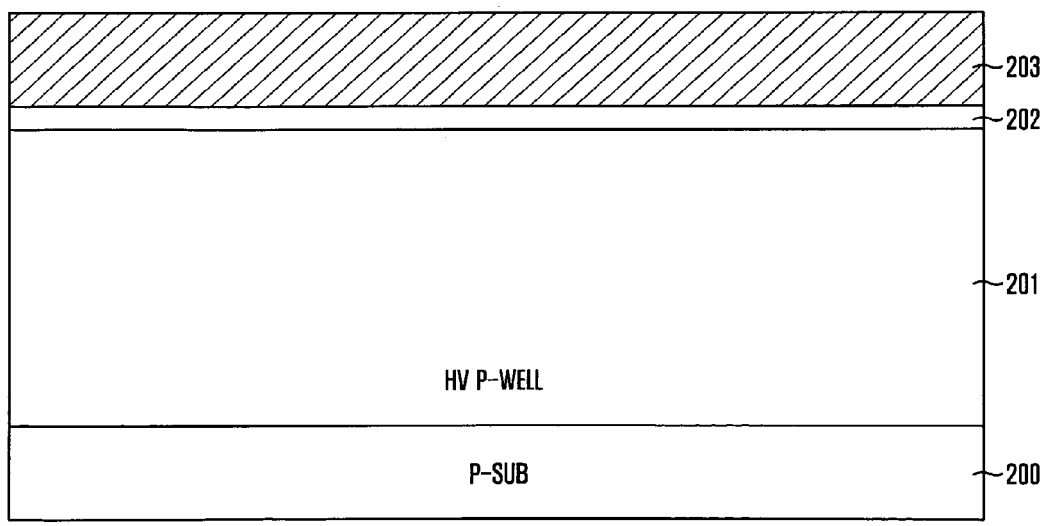

Referring to FIG. 3B, a buffer layer 202 may be formed over the substrate 200. The buffer layer 202 is formed to protect the substrate 200 from a stress caused during a deposition process and a removing process of a hard mask 203 to be formed in a subsequent process. Thus, the buffer layer 202 may be formed of a material having an etch selectivity to the hard mask 203. For example, when the hard mask 203 includes a nitride layer such as a silicon nitride ($Si_3N_4$) layer, the buffer layer 202 includes a silicon dioxide ($SiO_2$) layer formed by an oxidation process. The oxidation process may be performed by using a dry oxidation process, a wet oxidation process or an oxidation process using radical ion.

Then, the hard mask 203 is formed over the buffer layer 202. The hard mask 203 may act as an etch stop layer in order to compensate for lack of a thickness of a photoresist pattern used as an etch mask. The hard mask 203 may include a nitride layer such as a silicon nitride ($Si_3N_4$) layer and may be formed by using a low pressure chemical vapor deposition (LPCVD) process in order to minimize the stress caused during the forming of the hard mask 203.

Figure 3C:
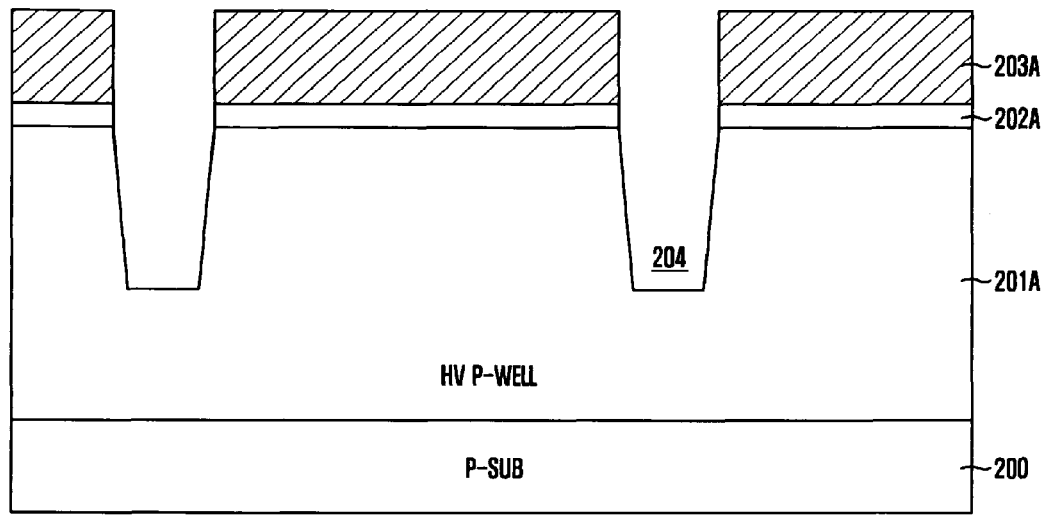

Referring to FIG. 3C, a trench 204 is formed by selectively etching a portion of the hard mask 203, the buffer layer 202 and the well region 201. Herein, the resultant elements are represented as hard mask patterns 203A, buffer patterns 202A and an etched well region 201A. The trench 204 is formed with a depth greater than that of a drift region (206 of FIG. 3F) which will be formed in a subsequent process. For example, the depth of the trench 204 ranges from approximately 1.1 times to approximately 2 times of the depth of the drift region 206. More specifically, the trench 204 has the depth approximately 0.1 μm to approximately 1 μm greater than that of the drift region 206.

In accordance with another embodiment of the present invention, a compensation layer (not shown) may be further formed along inside walls of the trench 204, wherein the compensation layer is formed to compensate a damaged portion formed during the forming of the trench 204 and decrease a critical dimension of an active region. The compensation layer may be formed by using an oxidation process and a thickness of the same is approximately 50 Å to 100 Å.

Figure 3D:
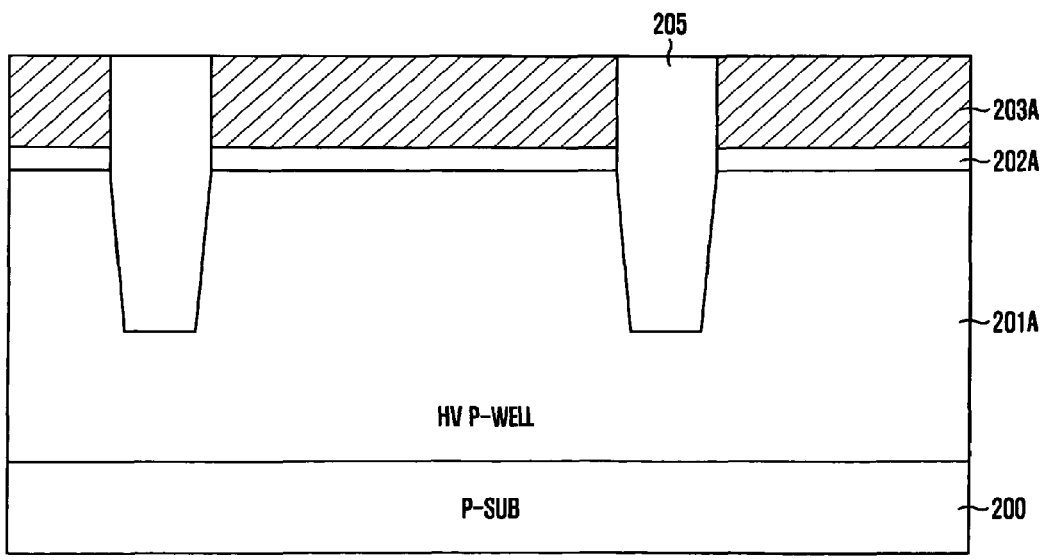

Referring to FIG. 3D, an insulation layer for device isolation is formed to fill the trench 204 and then, a planarization process is performed on the insulation layer to form an isolation layer 205. The isolation layer 205 includes an HDP layer or a stacked structure of an HDP layer and an SOD layer. Furthermore, the planarization process may be performed by using an etch back process or a chemical mechanical polishing (CMP) process. When the CMP process is performed, slurry for polishing an oxide layer is used while using the hard mask patterns 203A as a polishing stop layer.

Figure 3E:
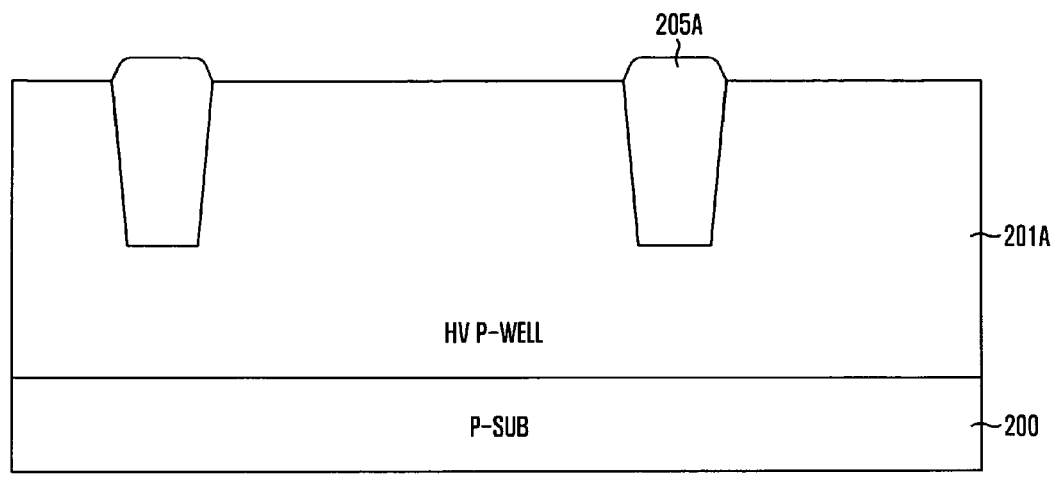

Referring to FIG. 3E, the hard mask patterns 203A are removed. The removing of the hard mask patterns 203A may be performed by using a phosphoric acid ($H_3PO_4$) solution. Then, the buffer patterns 202A are removed. The removing of the buffer patterns 202A may be performed by using a diluted hydro fluoride (DHF) solution or a buffered oxide etchant (BOE) solution.

A portion of the isolation layer 205 may be etched during the removing of the hard mask patterns 203A and the buffer patterns 202A, so that there is formed an etched isolation layer 205A having a protruding portion with a steady profile as shown in FIG. 3E.

Figure 3F:
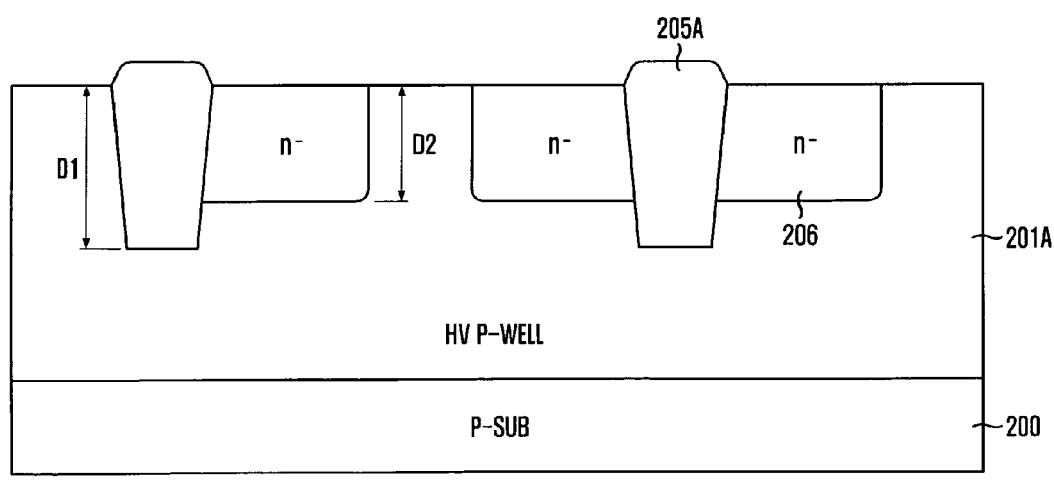

Referring to FIG. 3F, the drift region 206 is formed in the etched well region 201A. Herein, it is preferable that the drift region 206 is formed by using an ion implantation process in lieu of a diffusion process and a depth D2 of the drift region 206 should be less than the depth D1 of the trench 204. For example, the depth of the drift region 206 ranges from approximately a half to approximately 0.91 times of the depth of the trench 204. More specifically, the drift region 206 has the depth approximately 0.1 μm to approximately 1 μm less than that of the trench 204.

Furthermore, when forming an NMOS transistor, the drift region 206 is formed by using n-type impurity ions such as phosphorus (P) or arsenide (As). When forming a PMOS transistor, the drift region 206 is formed by using p-type impurity ions such as boron (B). Moreover, the drift region 206 is formed to have the concentration less than the concentration of a source/drain region (211 of FIG. 3H) to be formed in a subsequent process.

Figure 3G:
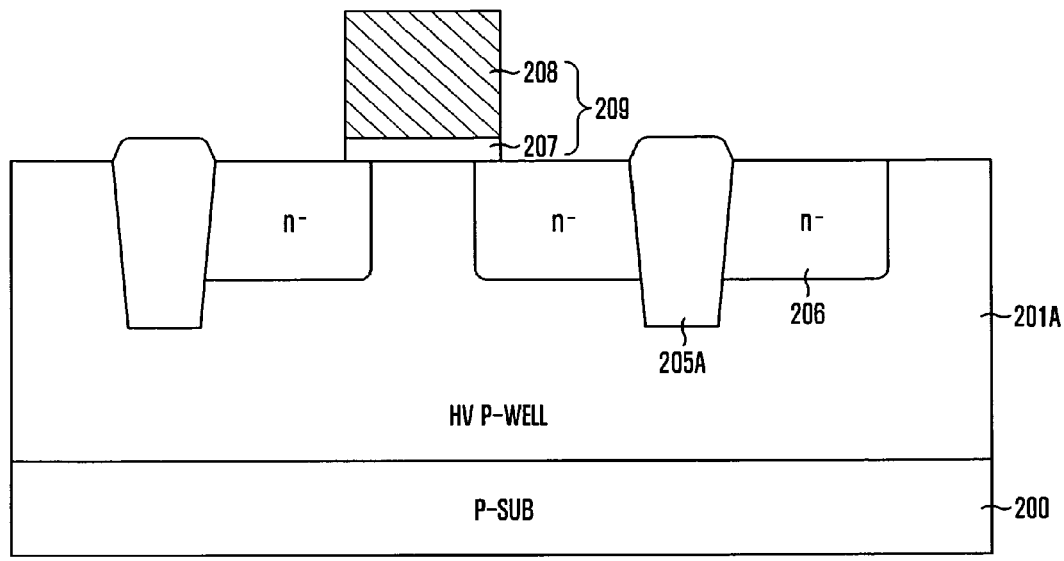

Referring to FIG. 3G, the insulation layer 207 for a gate is formed over the substrate 200. The insulation layer 207 may include a silicon dioxide ($SiO_2$) layer. Alternatively, the insulation layer 207 may be formed by performing a heat treatment process using nitride such as a nitrogen ($N_2$) gas after forming a silicon dioxide ($SiO_2$) layer to form a nitride layer at an interface between the silicon dioxide layer and the etched well region 201A. The insulation layer 207 may be formed by using a dry oxidation process, a wet oxidation process or an oxidation process using radical ions. However, as a matter of considering characteristics of the insulation layer 207, it is preferred that the forming of the insulation layer 207 is performed by using the dry oxidation process or the wet oxidation process in lieu of the oxidation process using the radical ions. In the meantime, the heat treatment using the $N_2$ gas may be performed in a furnace. The insulation layer 207 has a thickness ranging from approximately 50 Å to approximately 100 Å.

The conductive layer 208 for the gate is formed over the insulation layer 207. Herein, the conductive layer 208 may include any conductive materials. For example, the conductive layer 208 may include one of polysilicon, transition metals and rare earth metals. The polysilicon layer includes an undoped polysilicon layer which is not doped with impurities and a doped polysilicon layer which is doped with impurities, wherein impurity ions are doped into the undoped polysilicon layer in a subsequent ion implantation process when the undoped polysilicon layer is used. The polysilicon layer is formed by using an LPCVD method. The LPCVD method is performed by using a silane ($SiH_4$) gas as a source gas and using a phosphine ($PH_3$) gas, a boron trichloride ($BCl_3$) gas or a diborane ($B_2H_6$) gas as a doping gas. The transition metals include Fe, Co, W, Ni, Pd, Pt, Mo and Ti and the rare earth metals include Er, Yb, Sm, Y, La, Ce, Tb, Dy, Ho, Tm and Lu. The gate electrode 209 is formed by etching portions of the conductive layer 208 and the insulation layer 207.

Figure 3H:
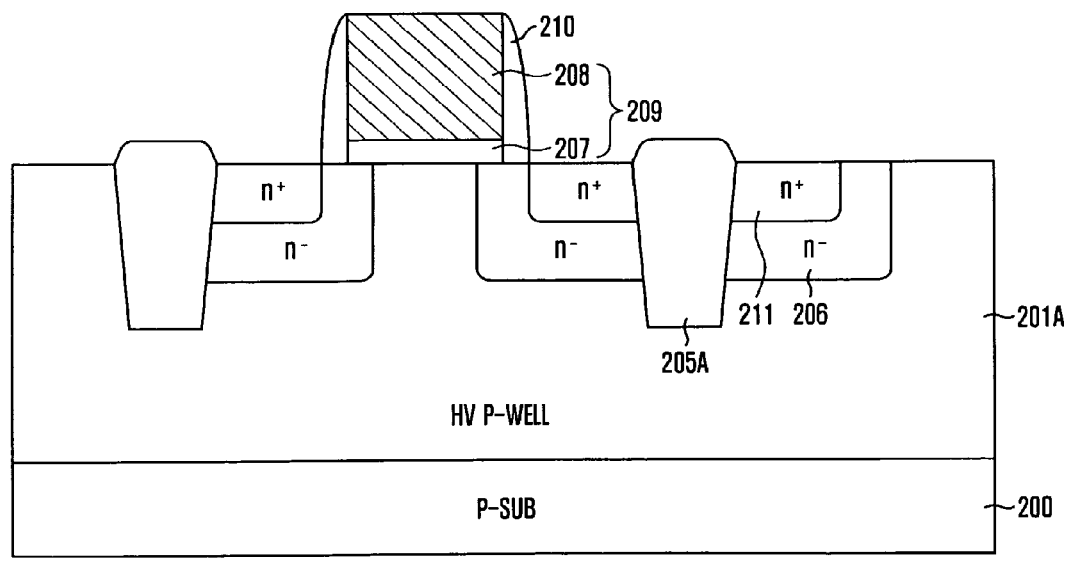

Referring to FIG. 3H, the spacers 210 are formed on sidewalls of the gate electrode 209. The spacers 210 may include an oxide layer, a nitride layer or a stacked structure of the oxide layer and the nitride layer. The source/drain regions 211 are formed in the drift region 206 exposed by the spacers 210, wherein the source/drain regions 211 are formed by an ion implantation process while having the same conduction-type as the drift region 206. However, a doping concentration of the source/drain regions is greater than that of the drift region 206.

Figure 3I:
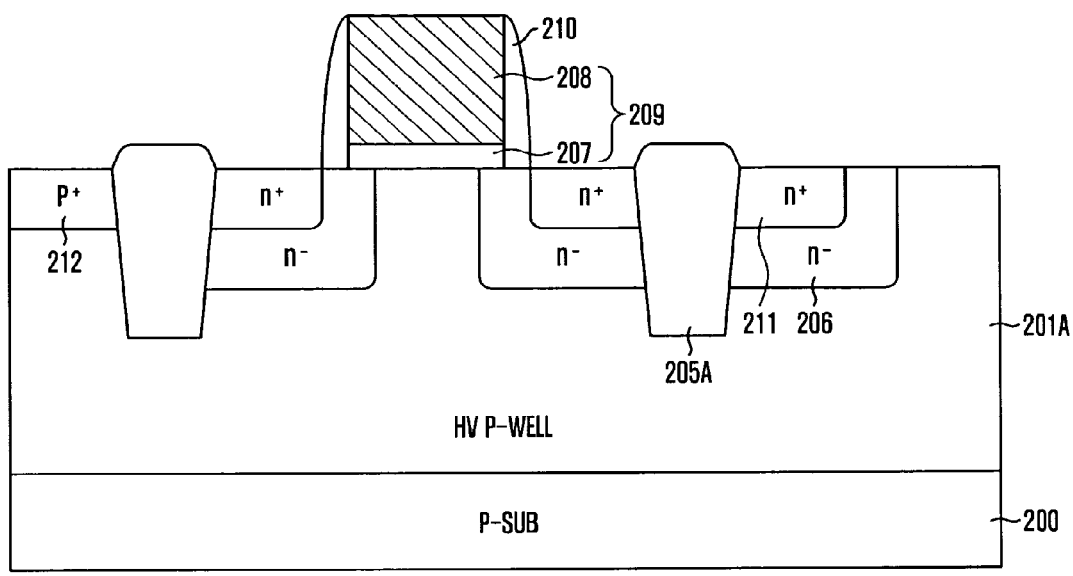

Referring to FIG. 3I, the pick-up region 212 is formed in the etched well region 201A, wherein the pick-up region 212 has the same conduction-type as the etched well region 201A.

Since subsequent processes are the same as other conventional processes, the processes are not described herein.

The present invention including the above described elements has the following effects.

Primarily, in accordance with the present invention, the forming of the FSA can be omitted as neighboring drift regions are isolated by an isolation layer formed deeper than a drift region. Thus, a width of a field region can be decreased since there is no need to secure an area for the FSA. Furthermore, the high integration of devices can be obtained. Moreover, a process for fabricating a device can be simplified since there is no need to form the FSA.

Secondly, in accordance with the present invention, as neighboring drift regions are isolated by an isolation layer formed deeper than a drift region, a location margin of a gate electrode can be ensured by maximally controlling the inducement of a channel under the isolation layer. That is, even though the gate electrode is formed over the isolation layer, the channel cannot be induced under the isolation layer due to the isolation layer having the greater depth than the drift regions. Thus, the location margin of the gate electrode during the forming of the gate electrode is ensured that much.

Thirdly, in accordance with the present invention, as neighboring drift regions are isolated by an isolation layer formed deeper than drift regions, the drift regions can be formed on sidewalls of the isolation layers with a self-aligned method. Thus, a process for fabricating a device can be simplified since there is no need to perform an additional mask alignment.

While the present invention has been described with respect to the specific embodiments, the above embodiments of the present invention are illustrative and not, limitative. It will be apparent to those skilled in the art that various changes and modifications may be made without departing from the spirit and scope of the invention as defined in the following claims.

What is claimed is:

1. A method for fabricating a high voltage device, the method comprising:
    forming a well region in a substrate;
    forming a trench structure by etching a portion of the well region;
    filling the trench structure with an insulation layer;
    performing a planarization process on the insulation layer to form isolation regions in the well region;
    forming substantially simultaneously drift regions in the well region through a first ion implantation process, two of the drift regions disposed on opposing sides of one isolation region among the isolation regions and being isolated by the one isolation region, and the drift regions having a different conduction type from the well region and having a depth less than that of the isolation regions; and
    forming a first gate electrode over the well region and a portion of one of the two drift regions but not a portion of the other of the two drift regions,
    wherein a second gate electrode is not formed over the other of the two drift regions.

2. The method as recited in claim 1, wherein the drift regions have a depth ranging from approximately 0.5 times to approximately 0.9 times the depth of the isolation regions.

3. The method as recited in claim 1, wherein the isolation regions have a depth approximately 0.1 µm to approximately 1 µm greater than that of the drift regions.

4. The method as recited in claim 1, wherein a width of the isolation regions ranges from approximately 1.0 µm to approximately 1.2 µm.

5. The method as recited in claim 1, wherein at least one side of each of the two drift regions formed on the opposing sides of the one isolation region contacts the one isolation region.

6. The method as recited in claim 1, wherein the isolation regions comprise a high density plasma (HDP) layer or a stacked structure of the HDP layer and a spin on dielectric (SOD) layer.

7. The method as recited in claim 1, wherein one side of at least one of the drift regions is aligned on a sidewall of one of the isolation regions.

8. The method as recited in claim 1, wherein a distance between one of the two drift regions and another drift region separate from the two drift regions ranges between approximately 1.0 µm to approximately 1.2 µm.

9. The method as recited in claim 1, wherein the well region is a p-type region, and the drift regions are n-type regions.

10. The method as recited in claim 1, wherein the two drift regions formed on the opposing sides of the one isolation region have a same conductivity type.

11. The method as recited in claim 1, wherein the isolation regions comprise a protruding portion that protrudes above the top surface of the substrate.

12. The method as recited in claim 1, further comprising forming source and drain regions in the drift regions, and wherein the forming of the source and drain regions in the drift regions comprises forming substantially simultaneously a source region and a drain region on two opposing sides of the one isolation region through a second ion implantation process, each of the source region and the drain region contacting at least one side of the one isolation region.

13. The method as recited in claim 1, wherein the drift regions have a distance L between the two of the drift regions that is larger than a distance $L_{ij}$ between one of the two drift regions and another drift region separate from the two drift regions.

14. The method recited in claim 1, further comprising forming a pick up region having a first conductivity type in the well region and being electrically isolated from a source region formed in one of the two drift regions.

15. The method recited in claim 14, wherein the pick up region has a depth less than that of one drift region.

16. The method recited in claim 14, wherein the pick up region is formed after forming the source region and a drain region, the drain region being formed in one of the two drift regions.

17. The method recited in claim 1, further comprising forming a pick up region having a first conductivity type in the well region and being electrically isolated from the drift regions.

18. The method recited in claim 1, wherein the isolation regions have a depth approximately 1 µm to approximately 1.5 µm.

19. The method recited in claim 1, wherein the drift region regions have a depth approximately 0.6 µm to approximately 0.8 µm.

20. A method for fabricating a high voltage device, the method comprising:
    forming a well region having a first conductivity type in a substrate having the first conductivity type;
    forming a trench structure by etching a portion of the well region;
    filling the trench structure with an insulation layer;
    performing a planarization process on the insulation layer to form isolation regions in the well region;
    forming substantially simultaneously drift regions having a second conductivity type in the well region comprising two neighboring drift regions having the second conductivity type contacting opposing sides of a first isolation region among the isolation regions and a third drift region having the second conductivity type contacting a side of a second isolation region among the isolation regions through an ion implantation process, the drift regions having a depth less than that of the isolation regions;
    forming a gate insulation layer;
    forming a conductive layer;
    etching the conductive layer to form a gate electrode over the well region and a portion of the drift regions; and
    forming source and drain regions having a second conductivity type in the two neighboring drift regions and the third drift region, and followed by forming a pick up region having a first conductivity type in the well region on an opposite side of the second isolation region from the third drift region, and wherein neither of the two neighboring drift regions is overlapped by a second gate electrode.

21. The method recited in claim 20, wherein the pick up region has a depth less than that of the third drift region.

22. The method recited in claim 20, wherein the pick up region is electrically isolated from the third drift region by the second isolation region.

* * * * *